(12) United States Patent
Kmetz

(10) Patent No.: US 7,510,742 B2
(45) Date of Patent: Mar. 31, 2009

(54) MULTILAYERED BORON NITRIDE/SILICON NITRIDE FIBER COATINGS

(75) Inventor: Michael Kmetz, Colchester, CT (US)

(73) Assignee: United Technologies Corporation, Hartford, CT (US)

(*) Notice: Subject to any disclaimer, the term of this patent is extended or adjusted under 35 U.S.C. 154(b) by 180 days.

(21) Appl. No.: 11/282,214

(22) Filed: Nov. 18, 2005

(65) Prior Publication Data
US 2007/0117484 A1 May 24, 2007

(51) Int. Cl.
C23C 16/34 (2006.01)
C23C 16/00 (2006.01)
B05D 1/36 (2006.01)

(52) U.S. Cl. .......................... 427/255.15; 427/255.394; 427/255.38; 427/255.11; 427/419.7; 427/402

(58) Field of Classification Search .................. None
See application file for complete search history.

(56) References Cited

U.S. PATENT DOCUMENTS

| | | | |
|---|---|---|---|
| 4,312,921 A | | 1/1982 | Hirai et al. |
| 4,393,097 A | * | 7/1983 | Hirai et al. .................. 423/324 |
| 4,565,747 A | * | 1/1986 | Nakae et al. ................. 428/698 |
| 4,866,746 A | | 9/1989 | Nakahigashi et al. |
| 4,900,526 A | * | 2/1990 | Matsuda et al. .............. 423/290 |
| 4,946,514 A | | 8/1990 | Nakagawa et al. |
| 4,948,482 A | * | 8/1990 | Kobayashi et al. ...... 204/192.23 |
| 5,298,287 A | | 3/1994 | Veltri et al. |
| 5,389,450 A | * | 2/1995 | Kennedy et al. ............. 428/552 |
| 5,707,471 A | * | 1/1998 | Petrak et al. .............. 156/89.27 |
| 2003/0201540 A1 | * | 10/2003 | Ahn et al. ................... 257/760 |

FOREIGN PATENT DOCUMENTS

| | | |
|---|---|---|
| EP | 0442490 | 8/1991 |
| EP | 1004558 | 5/2000 |
| JP | 63-187254 | 8/1988 |
| JP | 6-213690 | 8/1994 |
| WO | WO 95/27292 | 10/1995 |

OTHER PUBLICATIONS

Morosanu, C.E. "Thin films by Chemical Vapor Deposition", Thin Films Science and Technology, 7, 1990, Elsevier, 431-435.*
Pierson, Hugh. "Handbook of Chemical Vapor Deposition (CVD): Principles, Technology and Applications", 1992. Noyes Publications, 219-225.*

* cited by examiner

Primary Examiner—Timothy H Meeks
Assistant Examiner—David Turocy
(74) Attorney, Agent, or Firm—Bachman & LaPointe, P.C.

(57) ABSTRACT

A composite is described which has particular utility in the formation of components for gas turbine engines. The composite broadly comprises a substrate having a surface and at least one layer of a $BN/Si_3N_4$ coating on the substrate surface. The coating preferably is formed by alternative layers of a BN material and a $Si_3N_4$ material. The substrate may be a cloth material with fibers, such as SiC fibers, woven therein.

15 Claims, 3 Drawing Sheets

MULTILAYERED BORON NITRIDE/SILICON NITRIDE FIBER COATINGS

STATEMENT OF GOVERNMENT INTEREST

The Government of the United States of America may have rights in the present invention as a result of Contract No. NAS3-26385 awarded by the National Aeronautics and Space Administration.

BACKGROUND OF THE INVENTION

The present invention relates to multilayered boron nitride/silicon nitride (BN/$Si_3N_4$) coatings and to a method and a system for forming such coatings.

Composite coatings are used in a number of gas turbine engine applications. It is important for these coatings to demonstrate resistance to recession and high temperature oxidation stability.

One of the problems with ceramic matrix composites is the instability of the fiber matrix interface to oxidation. The use of boron nitride as a replacement for carbon has showed an improvement in resistance to high-temperature oxidation. However, it is common knowledge that the oxidation resistance of CVD boron nitride fiber coatings in the presence of moisture is considerably lower. CVD boron nitride fiber coatings have been known to degrade at room temperature in the presence of moisture.

There has been an investigation on the effect of alternating layers of SiC and carbon in SiC/SiC composites. It has been found that in such a system the room temperature mechanical properties are similar to a SiC/SiC composite fabricated with a normal carbon interface. However, when the composite is prestrained beyond the proportional limit (so that the matrix was micro-cracked) and subjected to high temperature oxidation, the composite exhibits brittle mechanical properties. This has been attributed to the removal of the carbon interface by oxidation. In order to enable this type of system to work in elevated temperature applications, a material with a greater oxidation resistance than carbon has to be substituted.

Some speculated that boron nitride could be substituted for the carbon. The major problem with such a substitution however is in the processing of the material. Boron nitride is usually fabricated by reacting a boron halogen with ammonia. The deposition of SiC is affected by the presence of ammonia. Therefore, the deposition of boron nitride has to be carried out in a separate reactor. This results in extra heating/cooling cycles in the process and additional handling of the part from one reactor to the other. This makes a boron nitride/silicon carbide multilayering concept unattractive.

SUMMARY OF THE INVENTION

Coatings provided by the present invention exhibit improved high temperature oxidation stability.

In accordance with the present invention, there is provided a composite which broadly comprises a substrate having a surface and at least one layer of a BN/$Si_3N_4$ coating on the substrate surface. The coating preferably is formed by alternative layers of a BN material and a $Si_3N_4$ material. In a preferred embodiment of the present invention, the substrate is a cloth material with fibers, such as SiC fibers, woven therein.

Further, in accordance with the present invention, a method for forming a coating having high temperature oxidation stability broadly comprises the steps of placing a substrate in a reaction chamber, heating the substrate to a deposition temperature, and forming at least one coating layer on the substrate. The forming step comprises introducing ammonia and nitrogen into the reaction chamber, introducing a boron halogen precursor into the reaction chamber, stopping the flow of the boron halogen precursor, and introducing a silicon halogen precursor into the reaction chamber.

Still further, in accordance with the present invention, a system for forming a coating having a high temperature oxidation stability broadly comprises a reaction chamber for holding the substrate to be coated and means for forming a multilayered BN/$Si_3N_4$ coating on the substrate.

Other details of the multilayered boron nitride/silicon nitride fiber coatings of the present invention, as well as other objects and advantages attendant thereto, are set forth in the following detailed description and the accompanying drawings, wherein like reference numerals depict like elements.

DETAILED DESCRIPTION OF THE PREFERRED EMBODIMENT(S)

The present invention is directed to an improvement in the high temperature oxidation stability of a boron nitride (BN) interface that may be used in ceramic matrix composites (CMC's). CMC's possessing a BN interface are candidate materials for use in various components or parts for engines, such as gas turbine engines.

In accordance with the present invention, a coating is provided which has an alternating multilayered interface formed from BN/$Si_3N_4$. The coating surrounds fibers, such as SiC fibers in a substrate material, and bonds the fibers to a surrounding matrix. The coating on fibers becomes the fiber interface in a matrix. This provides the correct amount of de-bonding in the composite. If the matrix is bonded too strongly to the fibers, the composite acts like a monolithic material. If the fiber interface is too weak, the load is not transferred from the matrix to the fibers. This is the opposite of organic polymer matrix composites. There you want a strong bond to the fibers. The use of $Si_3N_4$ is preferred from a mechanical and oxidation standpoint as well as from a processing perspective. Silicon nitride possesses a lower modulus, superior thermal shock resistance, and a higher resistance to oxidation than SiC. These properties make silicon nitride a preferred material for use in a multilayered interface coating. The fabrication of silicon nitride is also performed in an ammonia atmosphere. This makes the process compatible with the fabrication of boron nitride and enables the process to be done in the same reactor.

Multilayered BN/$Si_3N_4$ coatings, in accordance with the present invention, may be deposited on any desired substrate. The substrate may be a metallic material or a non-metallic materials such as a ceramic. The substrate may also be a fabric cloth material having fibers, such as SiC fibers, woven therein. The substrate may be a preform shaped to a particular configuration or may be a preform to be cut or shaped later on. For example, the substrate may be a perform made from commercial materials such as those sold under the SYLRAMIC trade name and/or those sold under the HIGH-NICALON trade name. If desired, the substrate may comprise one or more layers or plies of a desired material. For example, the substrate may be performs fabricated by laying up eight plies of a 5-harness satin weave of either SYL-RAMIC or HIGH-NICALON cloth in a $[(0°/90°)_2]_s$ lay-up and compressing to a thickness of about 0.60 inches (1.524 cm.) in graphite tooling. Any high-temperature fibers can be used.

If desired, the substrate may be infiltrated with SiC prior to the application of the coating. The SiC infiltration may be carried out using any suitable technique known in the art.

Figure 1:
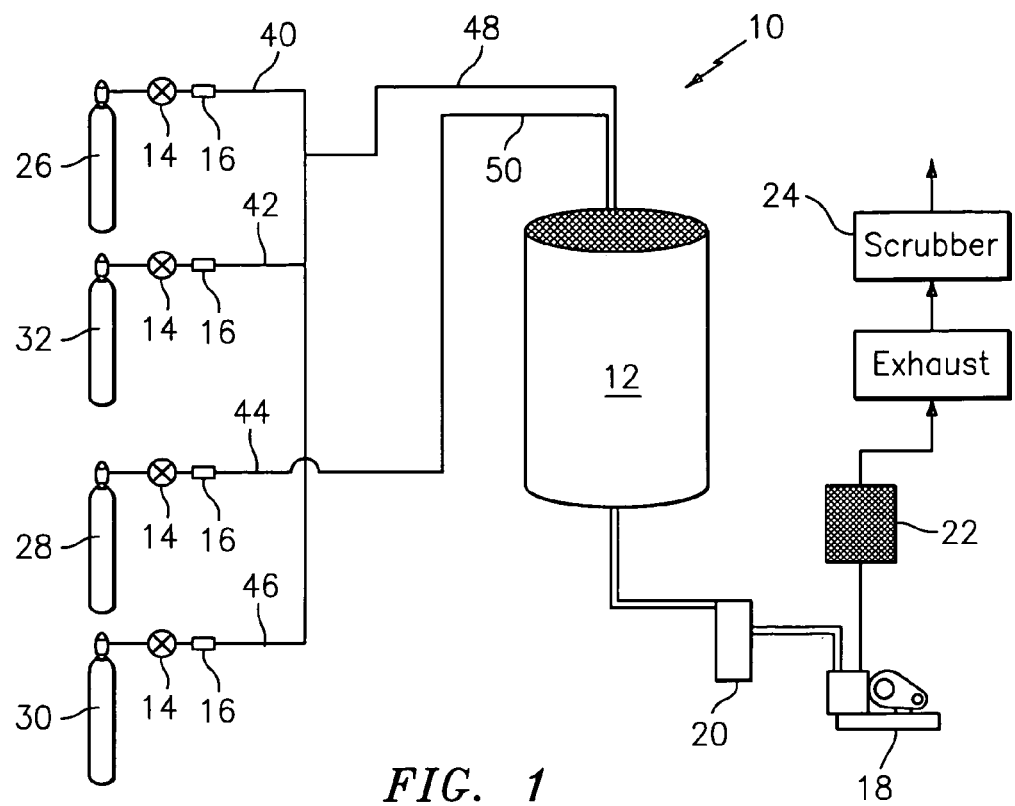
FIG. 1 illustrates a system for depositing the coatings of the present invention.

Referring now to FIG. 1, there is shown a system 10 used to deposit the coatings of the present invention. The system 10 includes a CVD reactor 12 having a reaction chamber 15 (see FIG. 2) into which the substrate 17 to be coated is placed. The reactor 12 communicates with a source 26 of a boron halogen gas via line 40, a source 32 of a silicon halogen gas via line 42, a source 28 of ammonia gas via line 44, and a source 30 of nitrogen gas via line 46. To control the flow of a respective gas, each of the lines 40, 42, 44, and 46 is provided with gas actuated on/off valve 14 and a mass flow controller 16. The system 10 further has a throttling valve 18 for keeping the pressure constant during the process, a trap 20 for receiving gaseous by-products of the present invention, a vacuum pump 22 for creating a particular pressure in the reaction chamber 15, and a scrubber 24. The scrubber 24 may be flowing water to scrub the exhaust.

Figure 2:
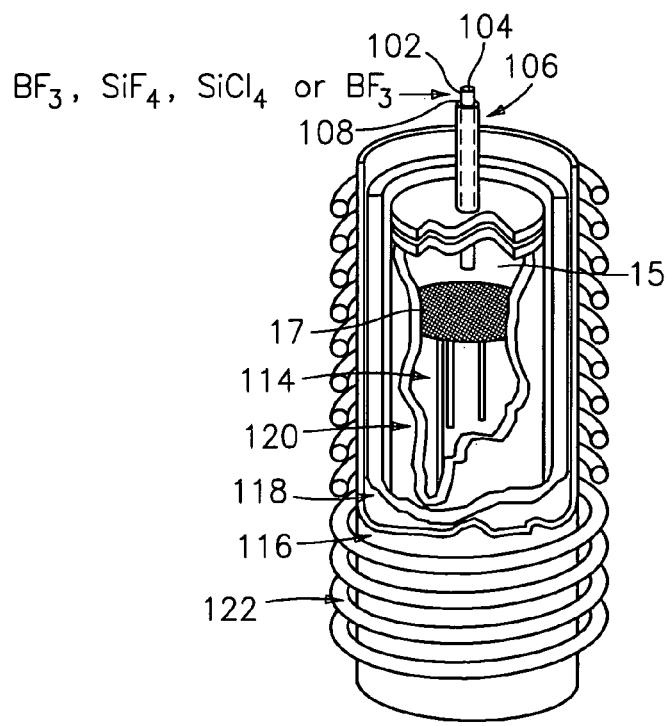
FIG. 2 illustrates a reaction chamber used in the system of FIG. 1.

In order to prevent the halogen precursors from reacting with the ammonia prematurely, the gases may be introduced separately using a tube inside tube configuration such as that shown in FIG. 2. The tube inside tube configuration includes a tube 102 having an inlet 104 for the halogen precursors surrounded by a tube 106 having an inlet 108 for the ammonia. The inlet 104 communicates with the halogen precursors and the nitrogen source via line 48. The inlet 108 communicates with the ammonia source via line 50.

A substrate 17, such as a preform formed from multiple plies of a cloth with woven SiC fibers, is positioned within the reaction chamber 15. Thermocouples 114 are provided to control and measure the temperature in the reaction chamber 15.

The reaction chamber 15 comprises a quartz containment tube 116 which surrounds a layer of insulation 118 which in turn surrounds a graphite susceptor 120. One or more induction heating coils 122 surround the reaction chamber 15 to provide the necessary heat for the reaction.

The substrate 17, which may be a tooled perform, ceramic cloth, or a part for a gas turbine engine, is placed in the reaction chamber 15 and is preferably brought up to temperature in an atmosphere of flowing nitrogen. The nitrogen enters the reaction chamber 15 via tube 102. Thereafter, a boron halogen precursor is allowed to flow into the reaction chamber 15 also via tube 102. The boron halogen precursor may be selected from the group consisting of $BF_3$, $BCl_3$, and mixtures thereof. The boron halogen precursor is allowed to flow for a time sufficient to form a boron nitride layer having a desired thickness, which time depends on the flow rate size of the reactor. The flow of the boron halogen precursor is then turned off using the valve 14. The pump 22 is allowed to pump the reaction chamber 15 for a period of time, such as 10 minutes, with the ammonia from source 28 and nitrogen from source 30 still flowing into the chamber 15. After this time period has elapsed, a silicon halogen precursor is allowed to flow from the tank 32 to the reaction chamber 15 for a time period sufficient to form a silicon nitride layer having a desired thickness. The silicon halogen precursor may be selected from the group consisting of $SiCl_4$, $SiF_4$, and mixtures thereof.

In order to form a coating having multiple layers, the foregoing process steps are repeated. Preferably the coating is provided with six to eight layers of boron nitride and six to eight layers of silicon nitride.

The deposition rate for the boron nitride formed from fluoride precursors has been found to be too low if the temperature in the reaction chamber 15 is below 1100° C. Thus, deposition temperatures may be varied for a $BF_3$ and $SiF_4$ system from 1100-1200° C. (2012-2175° F.). Temperatures above 1200° C. produce coated substrates with a thicker deposit on the exterior plies than on the interior plies. At 1100° C., the difference in the total coating thickness between the exterior ply and the innermost ply has been found to be less than 0.02 μm. At 1200° C., this difference has been found to be about 0.07 μm. For a $BCl_3$ and a $SiCl_4$ system, the deposition temperatures may be kept constant at a temperature in the range of 800° C. to 950° C., preferably at a temperature of 850° C. (1562° F.). Above 950° C., the formation of an undesirable homogeneous nucleation reaction has been observed in the boron nitride deposition. Deposition at a temperature less than 800° C. has shown large amounts of chloride in the coating. A deposition temperature of about 850° C. produces coatings that were consistent in thickness between the innermost and outermost plies.

It has been found that pressure also has an effect on deposition rate. Therefore, it is desirable to keep the pressure in the reaction chamber 15 at a pressure of 5 Torr or less. Preferably, the pressure in the reaction chamber 15 is kept constant at a pressure in the range of from 1 to 3 Torr for both chloride and fluoride variations. Most preferably, the pressure is about 2 Torr.

Table I presents the deposition conditions which may be used to deposit a multilayered coating with a boron nitride thickness of 0.05 μm and a silicon nitride layer thickness of 0.05 μm.

TABLE I

| Material | Flow rates (cm/min) | | | | | | Time (min) | Temperature ° C. | Deposition Rate[#] (u/hr) |
|---|---|---|---|---|---|---|---|---|---|
| | $BCl_3$ | $BF_3$ | $SiCl_4$ | $SiF_4$ | $NH_3$ | $N_2$ | | | |
| $Si_3N_4$* | — | — | 100 | — | 400 | 400 | 70 | 850 | 0.037 |
| BN* | 75 | — | — | — | 400 | 400 | 70 | 850 | 0.081 |
| $Si_3N_4$** | — | — | — | 100 | 400 | 400 | 56 | 1100 | 0.107 |
| BN** | — | 150 | — | — | 600 | 600 | 90 | 1100 | 0.066 |

*Made from the chloride precursor.
**Made from the fluoride precursor.
[#]Pressure was held constant at 2 torr.

For both chloride and fluoride systems, it has been found that the multilayered coatings of the present invention possess an iridescent multicolor appearance.

The effect of humidity on the strength of melt infiltrated composites was performed by subjecting melt infiltrated composites with different interfaces to long-term exposure to moisture followed by flexure testing. The composites were exposed at 140° F. in 95% relative humidity for 14 days. Four-point bending tests were used to evaluate the mechanical performance of the composites both in the as-fabricated state, pre-stressed condition, and the post exposure state. Specimens were pre-stressed to 35 ksi (significantly above the proportional limit stress) prior to environmental exposure to induce matrix cracks and associate damage within the material. The 35 ksi pre-stress level was selected based on the average load vs. deflection behavior of the composites which indicated that the proportional limit stress ranged from 26 to 34 ksi (179 t0 234 MPa). Pre-stressing was accomplished by loading one side of the specimen initially, and then flipping the specimen over and re-loading on the other side. High temperature oxidation tests were carried out by placing the composites in a tube furnace in an atmosphere of flowing air for 500 hours at temperatures of 1500° F. (815° C.) and 2000° F. (1093° C.) in an unstressed condition.

In addition, advanced environmental testing was conducted to investigate the ends-on oxidation rate in the presence of water vapor for four composites with different interfaces. The experimental procedure consisted of exposing machined composite specimens at temperatures ranging from 1292-1652° F. (700-900° C.) in various oxygen-water mixtures, where the partial pressure of water vapor was either 20% or 90%. Exposure time was varied from 1 to 100 hours, and measurements of the recession distance of the coating from the exposed ends on the machined surface were made as a function of exposure time and water vapor partial pressure. Measurements of recession distance were made by sectioning the composite specimen in the in-plane direction (parallel to the plies), polishing the section, and measuring the recession distance of the coating (by microscope) in several different locations along the machined edge. In general, the recession distances that are reported are averages of least ten separate measurements.

Figure 3:
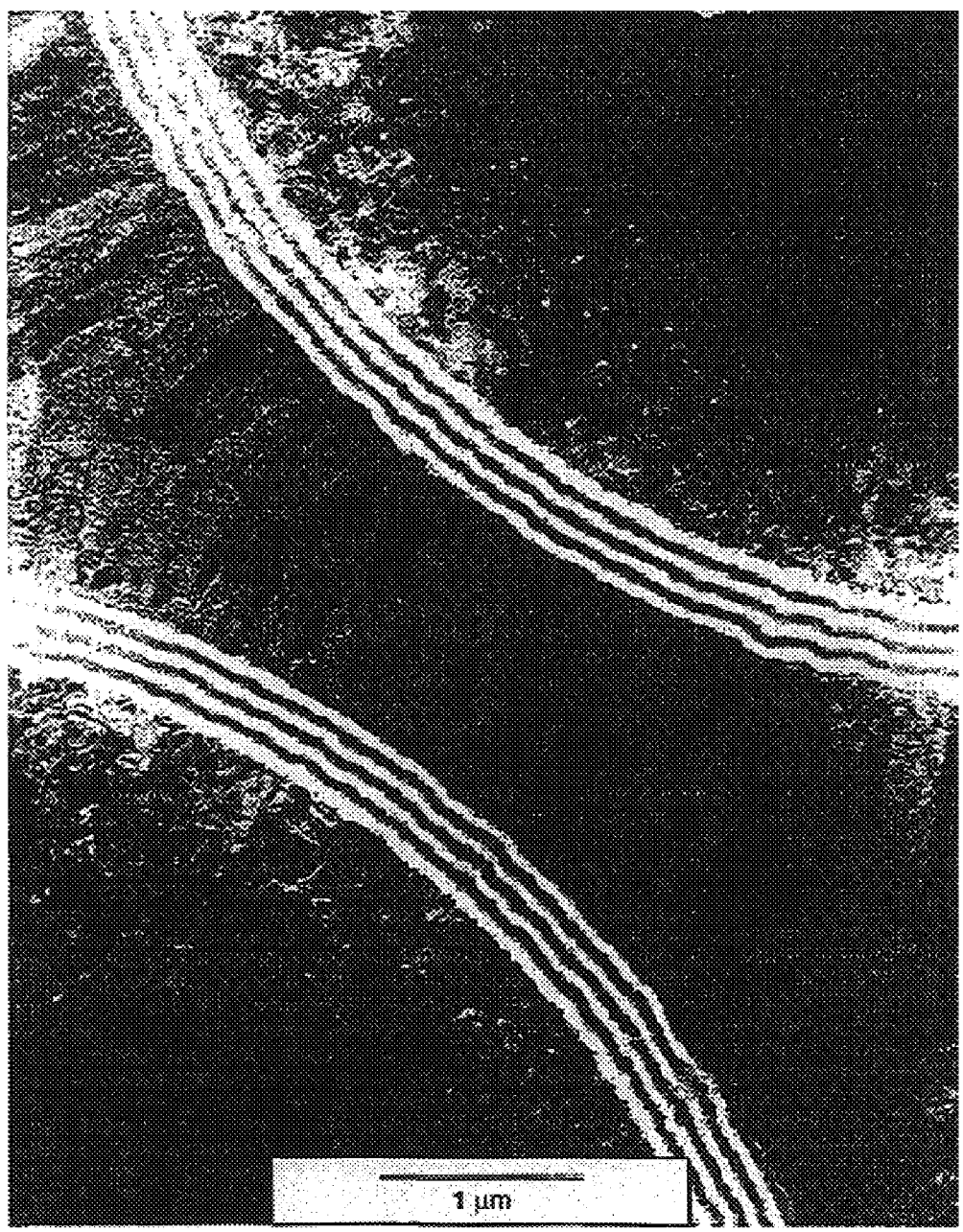
FIG. 3 is a TEM thin foil micrograph of a multilayered BN/$Si_3N_4$ coating in a SYLRAMIC™ SiC melt infiltrated composite.

FIG. 3 is a transmission electron micrograph (TEM) thin foil micrograph of a BN/Si$_3$N$_4$ multilayered coating in a SYLRAMIC, SiC melt infiltrated composite. The fiber appears in the lower right hand corner of the micrograph. The first layer closest to the fiber is boron nitride followed by the darker layer, Si$_3$N$_4$. The next six layers consist of alternating BN/Si$_3$N$_4$ layers. The matrix surrounding the last Si$_3$N$_4$ layer is SiC. Additional TEM thin foil micrographs verify that the coating was quite uniform throughout the composite. Scanning Auger Microscopy analysis of the coating confirmed that the individual layers were consistent in chemistry corresponding with BN and Si$_3$N$_4$.

Figure 4:
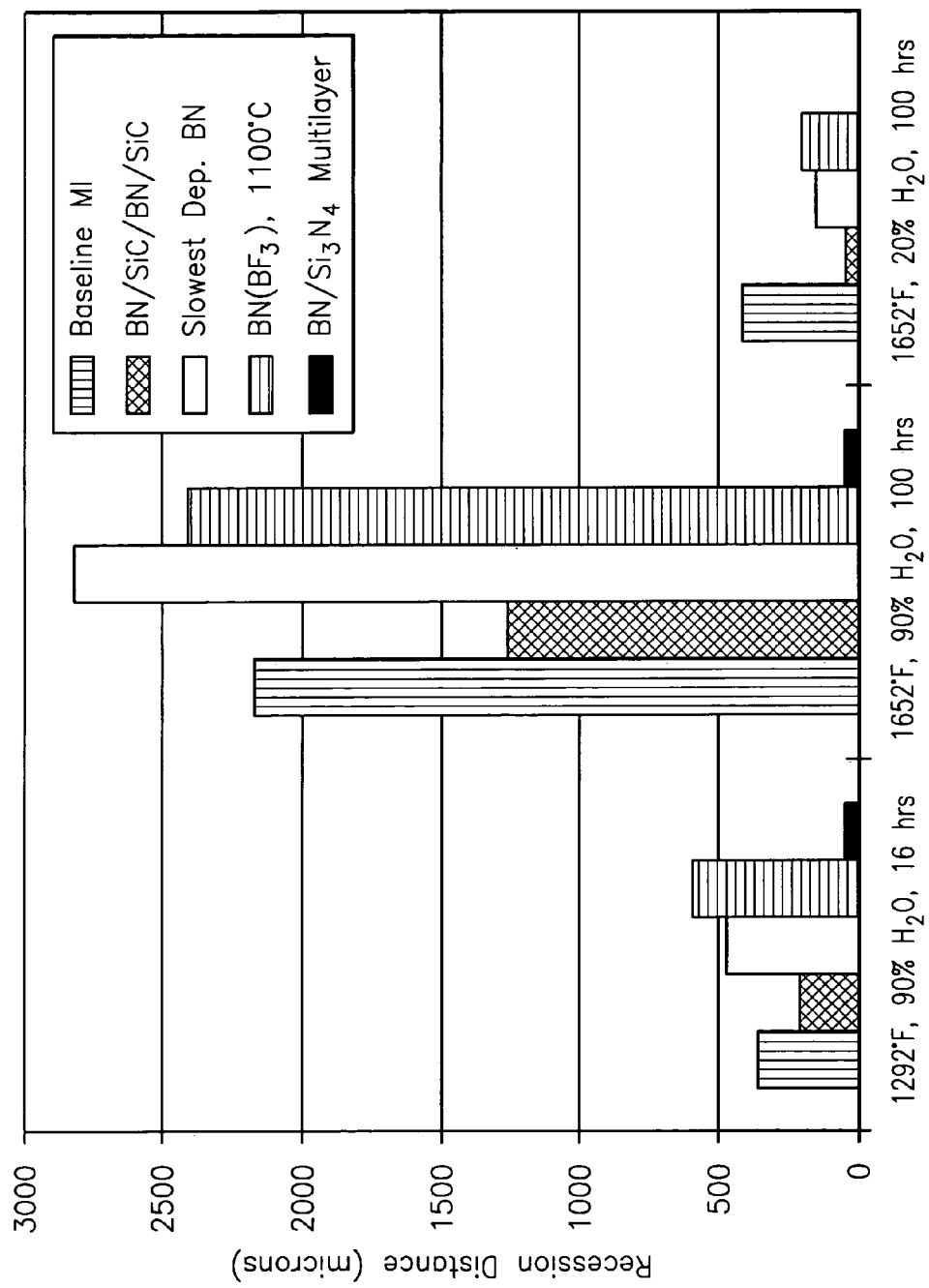
FIG. 4 is a graph showing coating recession distance as a function of environmental exposure for various interface candidates.

The results of the mechanical testing are shown in Table II for the following composites: (1) Melt Infiltration (MI) composites with a standard BN interface; (2) a composite having a BN interface produced from BF$_3$ precursor; (3) a composite having a BN interface that was deposited slow; (4) a composite having a BN/SiC/BN/SiC multilayered interface; and (5) a composite having a BN/Si$_3$N$_4$ multilayered coating. All of the composites were first prestrained to 35 ksi before environmental exposure. The results show that: (1) the test itself did not process the sensitivity needed to show the effects of moisture on the strength of the compositions; and (2) that the multilayered BN/Si$_3$N$_4$ interface composites had strengths in the same range as the baseline material. FIG. 4 shows the results of the measurements for the four interface development candidates (composites nos. 2-5) as well as the baseline MI composite (composite no. 1). There are several clear trends indicated by this data: (1) at constant temperature, higher moisture content resulted in considerably greater recession distances; (2) for a constant moisture content, recession distance was much more severe at higher temperature, and; (3) regardless of the temperature or partial pressure water vapor conditions investigated, the recession rates of the BN/SiC/BN/SiC and BN/Si$_3$N$_4$ multilayered interfaces were better than any of the other composites. The tests showed that the BN/Si$_3$N$_4$ multilayered coating was by far the best in terms of resistance to coating recession. Even under the most severe conditions of temperature and moisture content, the recession distance for this coating was less than 100 μm after 100 hours. The recession distance of the coating in the baseline MI composite was greater than 2000 μm under the same conditions.

TABLE II

| Type of Interface | Environmental Exposure | | | | |
| --- | --- | --- | --- | --- | --- |
| | None | None* | Humidity* | 1500° F., 500 hrs in air* | 2000° F., 500 hrs in air* |
| Baseline MI | 74 | 55 | 80 | — | — |
| | (1.00) | (0.74) | (1.08) | | |
| BN(BF$_3$), 1100° C. | 84 | 93 | 91 | 82 | 72 |
| | (1.00) | (1.11) | (1.08) | (0.98) | (0.86) |
| Slowest Dep. BN | 89 | 79 | 86 | 98 | 86 |
| | (1.00) | (0.89) | (0.97) | (1.10) | (0.97) |
| BN/SiC/BN/SiC | 85 | 70 | 87 | 99 | 95 |
| | (1.00) | (0.82) | (1.02) | (1.16) | (1.12) |
| BN/Si$_3$N$_4$ Multilayer | 83 | 87 | 80 | 82 | 75 |
| | (1.00) | (1.05) | (0.97) | (0.99) | (0.90) |

*Specimens were prestressed to 35 ksi on both sides prior to environmental exposure
Data is formed as follows:
top value indicates residual strength in ksi
bottom value indicates strength after normalization to as-fabricated strength It is apparent that there has been provided in accordance with the present invention multilayered boron nitride/silicon nitride fiber coatings which fully satisfies the objects, means, and advantages set forth hereinbefore. While the present invention has been described in the context of specific embodiments thereof, other unforeseeable alternatives, modifications, and variations will become apparent to those skilled in the art. Accordingly, it is intended to embrace those unforeseeable alternatives, modifications, and variations as fall within the broad scope of the appended claims.

What is claimed is:

1. A method for forming a coating comprising the steps of:
providing a reaction chamber having a first tube having a first inlet and a second tube having a second inlet;
placing a substrate in the reaction chamber;
said substrate placing step comprises placing a substrate made of at least one fabric ply having SiC fibers woven into each said ply in the reaction chamber;
heating the substrate to a deposition temperature;
forming at least one coating layer on said substrate; and
said forming step comprising introducing ammonia into said reaction chamber through said second tube and introducing nitrogen into said reaction chamber through said first tube, introducing a boron halogen precursor into said reaction chamber via said first tube to form a boron nitride layer, stopping the flow of said boron halogen precursor, and introducing a silicon halogen precursor into said reaction chamber through said first tube to form a silicon nitride layer,
said forming step further comprising pumping the reaction chamber with ammonia and nitrogen after the flow of said boron halogen precursor has stopped and before the flow of said silicon halogen precursor begins;
wherein said step of introducing said ammonia into said reaction chamber through said second tube prevents said boron halogen precursor and said silicon halogen precursor from reacting with said ammonia prematurely.

2. The method of claim 1, wherein said forming step further comprises repeating said boron halogen precursor introducing step followed by introducing said silicon halogen precursor a plurality of times.

3. The method of claim 1, wherein said boron halogen precursor introducing step comprises introducing $BF_3$ into said reaction chamber and said silicon halogen precursor introducing step comprises introducing $SiF_4$ into said reaction chamber.

4. The method of claim 3, maintaining a temperature in the range of from 1100 to 1200° C. in the reaction chamber during deposition of said boron nitride layer.

5. The method of claim 1, wherein said boron halogen precursor introducing step comprises introducing $BCl_3$ into said reaction chamber and said silicon halogen precursor introducing step comprises introducing $SiCl_4$ into said reaction chamber.

6. The method of claim 5, wherein said heating step comprises heating said substrate to a temperature of 850° C.

7. The method of claim 1, further comprising maintaining a pressure in the reaction chamber of 1-3 torr.

8. The method of claim 6, wherein said heating step comprises heating said substrate to a temperature in the range of from 850° C. to 950° C.

9. The method of claim 1, wherein said substrate placing step comprises providing a substrate formed from a plurality of fabric plies with each of said fabric plies having SiC fibers woven therein.

10. The method of claim 1, further comprising infiltrating said substrate with SiC.

11. The method of claim 1, wherein said heating step comprises heating said substrate in an atmosphere of flowing nitrogen.

12. The method of claim 1, wherein said reaction chamber providing step further comprises providing a reaction chamber wherein said second tube surrounds said first tube.

13. The method of claim 1, further comprising only said ammonia is introduced into said reaction chamber via said second tube.

14. A method for forming a coating comprising the steps of:
providing a reaction chamber having a first tube having a first inlet and a second tube having a second inlet;
placing a substrate in the reaction chamber;
said substrate placing step comprises placing a substrate selected from the group consisting of: a substrate made of at least one fabric ply having SiC fibers woven into each said ply in the reaction chamber; a gas turbine engine component; and a substrate made of a metallic material;
heating the substrate to a deposition temperature;
forming at least one coating layer on said substrate; and
said forming step comprising introducing ammonia into said reaction chamber through said second tube and introducing nitrogen into said reaction chamber through said first tube, introducing a boron halogen precursor into said reaction chamber via said first tube to form a boron nitride layer, stopping the flow of said boron halogen precursor, and introducing a silicon halogen precursor into said reaction chamber through said first tube to form a silicon nitride layer, and
wherein said forming step further comprises pumping the reaction chamber with ammonia and nitrogen after the flow of said boron halogen precursor has stopped and before the flow of said silicon halogen precursor begins.

15. The method of claim 14, wherein said substrate placing step comprises providing said substrate made of at least one fabric ply having SiC fibers woven into each said ply.

* * * * *

UNITED STATES PATENT AND TRADEMARK OFFICE
CERTIFICATE OF CORRECTION

PATENT NO. : 7,510,742 B2  Page 1 of 1
APPLICATION NO. : 11/282214
DATED : March 31, 2009
INVENTOR(S) : Michael Kmetz It is certified that error appears in the above-identified patent and that said Letters Patent is hereby corrected as shown below:

In column 7, claim 4, line 2, the "." after C and before in should be deleted.

In column 8, claim 8, line 3, the "." after C and before to should be deleted.

Signed and Sealed this

Twentieth Day of October, 2009

David J. Kappos
*Director of the United States Patent and Trademark Office*